(12) United States Patent
Park et al.

(10) Patent No.: US 6,870,186 B2
(45) Date of Patent: Mar. 22, 2005

(54) ORGANIC ELECTROLUMINESCENT DISPLAY DEVICE

(75) Inventors: Jae Yong Park, Gyeonggi-do (KR); Ock Hee Kim, Gyeonggi-do (KR); Choong Keun Yoo, Incheon (KR); Nam Yang Lee, Gyeonggi-do (KR); Kwan Soo Kim, Gyeonggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/330,310

(22) Filed: Dec. 30, 2002

(65) Prior Publication Data

US 2003/0201445 A1 Oct. 30, 2003

(30) Foreign Application Priority Data

Apr. 25, 2002 (KR) .............................. 10-2002-0022812

(51) Int. Cl.[7] .............................................. H01L 31/20
(52) U.S. Cl. .............................. 257/59; 257/72; 257/40; 257/E39.007
(58) Field of Search ............................. 257/59, 72, 40, 257/E39.007

(56) References Cited

U.S. PATENT DOCUMENTS

| | | | | |
|---|---|---|---|---|
| 5,294,869 A | * | 3/1994 | Tang et al. ................. | 313/504 |
| 5,920,080 A | * | 7/1999 | Jones .......................... | 257/40 |
| 5,929,474 A | * | 7/1999 | Huang et al. ............... | 257/292 |
| 6,608,449 B2 | * | 8/2003 | Fukunaga ................ | 315/169.3 |
| 2002/0113546 A1 | * | 8/2002 | Seo et al. ................... | 313/504 |

FOREIGN PATENT DOCUMENTS

JP      09-143836      6/1997

* cited by examiner

*Primary Examiner*—David Nelms
*Assistant Examiner*—Tu-Tu Ho
(74) *Attorney, Agent, or Firm*—Morgan Lewis & Bockius LLP

(57) ABSTRACT

An organic electroluminescent device includes first and second substrates attached by a seal pattern, array elements including a plurality of thin film transistors formed on the first substrate, a first electrode formed on a rear surface of the second substrate, a plurality of electrode separators formed on the rear surface of the first electrode, wherein the plurality of electrode separators is made of an insulating material defining sub-pixel regions that correspond to each thin film transistor, an organic electroluminescent layer formed on a rear surface of the first electrode in each of the sub-pixel regions, a second electrode formed on a rear surface of the organic electroluminescent layer in each of sub-pixel regions, a conductive connector formed between the first and second substrates in each sub-pixel region for connecting to the second electrode of a sub-pixel region.

28 Claims, 15 Drawing Sheets

Light-emitting Direction

ORGANIC ELECTROLUMINESCENT DISPLAY DEVICE

The present application claims the benefit of Korean Patent Application No. 2002-22812 filed in Korea on Apr. 25, 2002, which is hereby incorporated by reference in its entirety.

BACKGROUND OF THE INVENTION

1. Field of the Invention

The present invention relates to organic electroluminescent devices, and more particularly, to a top emission type active matrix organic electroluminescent device.

2. Discussion of the Related Art

Flat panel display devices—which are characterized as being thin, light weight and energy efficient—are in high demand in the display field as the information age rapidly evolves. A flat panel display device can be classified into one of two types depending on whether it emits or receives light. One type is a light-emitting type display device that emits light to display images, and the other type is a light-receiving type display device that uses an external light source to display images. Plasma display panels, field emission display devices, and electroluminescence display devices are examples of the light-emitting type display devices. Liquid crystal displays are examples of the light-receiving type display device.

Among the flat panel display devices, liquid crystal display (LCD) devices are widely used for laptop computers and desktop monitors because of their high resolution, good color rendering and superior image quality. However, the LCD device has some disadvantages, such as poor contrast ratio, narrow viewing angle, and difficulty in enlarging it to a very large size having millions of pixels. Therefore, new types of flat panel displays are needed to overcome the aforementioned disadvantages, but yet are still thin, light weight and have low power consumption.

Recently, organic electroluminescent display (OED) devices have been of the most interest in research and development because they are light-emitting type display devices having a wide viewing angle and a good contrast ratio as compared to the LCD device. The organic electroluminescent display device is a light-emitting type display device that does not require a backlight device, and can be light weight and thin. Further, the organic electroluminescent display device has low power consumption. A low voltage direct current can be used to drive the organic electroluminescent display device while obtaining a rapid response speed. As widely known, since the organic electroluminescent display device is totally in solid phase, unlike the LCD device, an OED device is sufficiently strong to withstand external impacts and has a greater operational temperature range. In addition, the organic electroluminescent display device can be manufactured at a lower cost than a LCD device. Moreover, since only the deposition and encapsulation apparatuses are necessary without having to inject liquid crystal in a process of manufacturing the organic electroluminescent display device, process management is simpler than in the manufacture of LCD devices.

One operating method for the organic electroluminescent display device is a passive matrix operating method that does not utilize thin film transistors. In this type of organic electroluminescent display device, scanning lines and signal lines, which are arranged in a matrix pattern, perpendicularly cross each other. A scanning voltage is sequentially applied to the scanning lines to operate each pixel. To obtain a required average luminance, the instantaneous luminances of each pixel during a selected period is intensified by increasing the number of scans during the period.

Another method of operating an organic electroluminescent display device is an active matrix operating method. The active matrix type organic electroluminescent display device usually includes thin film transistor pairs, which create a voltage storing capability for each of the pixels. The pair of thin film transistors includes a selection transistor and a drive transistor. The source/drain of the selection transistor is connected to a signal line for supplying a data signal when a scanning signal is applied to the gate scanning line. The gate of the drive transistor is connected to the drain/source of the selection transistor. A constant voltage line is connected to the source/drain of the drive transistor. In the structure of an active matrix type organic electroluminescent display device, a voltage applied to the pixels is stored in storage capacitors, thereby maintaining the signals until the next period for applying a signal voltage. As a result, a substantially constant current flows through the pixels, and the organic electroluminescent display device emits light at a substantially constant luminance during one frame period. Because a very low current is applied to each pixel of an active matrix type organic electroluminescent display, it is possible to enlarge the display device, thereby forming much finer and/or larger patterns having low power consumption.

The driving principle for a display apparatus according to the related art will now be described in FIG. 1 that shows an equivalent circuit diagram of pixels in the active matrix type organic electroluminescent display device in the related art. As shown in FIG. 1, scanning lines are arranged in a transverse direction, and signal lines are arranged in a longitudinal direction perpendicular to the scanning lines. A power supply line that is connected to a power supply provides a voltage to drive transistors and is also disposed in the longitudinal direction. A pixel is defined between a pair of signal lines and a pair of scanning lines. Each selection transistor, otherwise known as a switching thin film transistor (TFT), is disposed in the pixel near the crossing of the scanning line and signal line and acts as an addressing element that controls the voltage of a pixel. A storage capacitor $C_{ST}$ is connected to the power supply line and the drain/source of the switching TFT. Each drive transistor, otherwise known as a driving TFT has a gate electrode connected to the storage capacitor $C_{ST}$ and a source/drain connected to the power supply line and acts as a current source element for the pixel. An organic electroluminescent diode is connected to the drain/source of drive transistor.

The organic electroluminescent diode has a multi-layer structure of organic thin films between an anode electrode and a cathode electrode. When forward current is applied to the organic electroluminescent diode, electron-hole pairs combine in an organic electroluminescent layer as a result of a P—N junction between the anode electrode, which provides holes, and the cathode electrode, which provides electrons. The electron-hole pairs have a lower energy together when combined than when they were separated. The energy gap between combined and separated electron-hole pairs is converted into light by an organic electroluminescent element. That is, the organic electroluminescent layer emits the energy generated due to the recombination of electrons and holes when a current flows.

Organic electroluminescent devices are classified into a top emission type and a bottom emission type in accordance with a progressive direction of light emitted from the organic electroluminescent diode. In the bottom emission type device, light is emitted in a direction toward the substrate where the various lines and TFTs are disposed. However, in the top emission type device, light is emitted in a direction opposite to the substrate where the lines and TFTs are disposed.

FIG. 2 is a partial cross-sectional view of a bottom emission type organic electroluminescent device showing one pixel having red (R), green (G) and blue (B) sub-pixels regions according to the related art. As shown in FIG. 2, first and second substrates 10 and 30 are spaced apart from each other. The first and second substrates 10 and 30 are attached to each other and sealed by a seal pattern 40. Thin film transistors T and first electrodes 12 are formed on the first substrate 10, which is transparent. The pixel of the organic electroluminescent device generally includes three sub-pixel regions with the thin film transistor T and the first electrode 12 disposed in each sub-pixel region. An organic electroluminescent layer 14 is formed over the thin film transistors T and over the first electrodes 12. The organic electroluminescent layer 14 includes luminous materials that produce red (R), green (G) and blue (B) colors each corresponding to each thin film transistor T in each sub-pixel region. A second electrode 16 is formed on the organic electroluminescent layer 14. The first and second electrodes 12 and 16 supply the electric charges to the organic electroluminescent layer 14.

The seal pattern 40 attaches the first and second substrates 10 and 30 and maintains a cell gap between the first and second substrates 10 and 30. Furthermore, although not shown in FIG. 2, a hydroscopic material or a moisture absorbent material can be formed on an inner surface of the second substrate 30 in order to absorb the moisture within the cell gap between the first and second substrates 10 and 30 to protect the cell gap from moisture. In addition, a translucent tape may be interposed between the second substrate 30 and the hydroscopic material to tightly adhere the hydroscopic material to the second substrate 30.

In the related art shown in FIG. 2, if the first electrode 12 is anode and the second electrode 16 is cathode, the first electrode 12 is formed of a transparent conductive material and the second electrode 16 is formed of a metal having a small work function. The organic electroluminescent layer 14 includes a hole injection layer 14a, a hole transporting layer 14b, an emission layer 14c and an electron transporting layer 14d in sequential order from the first electrode 12. As mentioned before, the emission layer 14c includes luminous materials that emit red (R), green (G) and blue (B) colors in the corresponding sub-pixel regions.

FIG. 3 is an enlarged cross-sectional view of one pixel region of the bottom emission type organic electroluminescent display device shown in FIG. 2. In FIG. 3, an organic electroluminescent display device generally includes a thin film transistor (TFT) T and an organic electroluminescent diode E in a luminous emitting area L. A buffer layer 30 is formed on a transparent substrate 1. The TFT T includes a semiconductor layer 62 on the buffer layer 30, a gate electrode 68, a source electrode 82 and a drain electrode 80. A power electrode 72 extending from the power supply line is connected to the source electrode 80, and the organic electroluminescent diode E is connected to the drain electrode 82. A capacitor electrode 64 made of the same material as the semiconductor layer 62 is disposed below the power electrode 72. The power electrode 72 corresponds to the capacitor electrode 64, and an insulator is interposed therebetween, thereby forming a storage capacitor $C_{ST}$.

The organic electroluminescent diode E includes the first electrode 12, the second electrode 16 and the organic electroluminescent layer 14 interposed between the first electrode 12 and the second electrode 16. The organic electroluminescent device shown in FIG. 3 has a luminous area L where the organic electroluminescent diode E emits light produced therein. Furthermore, the organic electroluminescent display device has array elements A that include the TFT T, the storage capacitor $C_{ST}$, the various lines and the various insulators, and on which the organic electroluminescent diode E is disposed. In the related art shown in FIG. 3, the organic electroluminescent diode E and the array elements A are formed on the same substrate.

FIG. 4 is a flow chart illustrating a fabrication process of an organic electroluminescent device of FIG. 3 according to the related art. Step st1 denotes a process of forming the array elements on the first substrate in which the first substrate is a transparent substrate. For example, the scanning lines, the signal lines and the switching and driving thin film transistors are formed on and over the first substrate. The signal lines are formed perpendicularly across the scanning lines. Each of the switching thin film transistors is disposed near a crossing of the scanning and signal lines. The formation of the array elements also includes forming the storage capacitors and the power supply lines.

In step st2 of FIG. 4, the first electrode of the organic electroluminescent diode is formed. The first electrode is in each sub-pixel region. The first electrode is also connected to the drain/source of the driving thin film transistor in each sub-pixel region.

In step st3 of FIG. 4, the organic electroluminescent layer is formed on the first electrode. If the first electrode is the anode, the organic electroluminescent layer is formed to have a sequential multiple structure of a hole injection layer, a hole transporting layer, an emission layer and an electron transporting layer on the first electrode. If the first electrode is the cathode, the sequence is reversed In step st4 of FIG. 4, the second electrode of the organic electroluminescent diode is formed on the organic electroluminescent layer. The second electrode covers the entire surface of the first substrate. The second electrode also acts as a common electrode.

Step st5 of FIG. 5 is a process step for encapsulating the first and second substrates. In this step st5, a second substrate is attached to the first substrate having the array elements and the organic electroluminescent diode. The second substrate protects the organic electroluminescent diode of the first substrate from external impacts. Because the first substrate is encapsulated with the second substrate, the organic electroluminescent diode is protected from the outer atmosphere. As mentioned before, the second substrate can have the hydroscopic material on the inner surface thereof.

The yield of array elements depends on the yield of organic electroluminescent layer. The fabrication yield of organic electroluminescent layer determines and controls the total fabrication yield of organic electroluminescent layer. For example, although the thin film transistors are formed without any defects on the first substrate, the first substrate having both the array elements and the organic electroluminescent layer is decided to be an inferior product if some defects occur in later processes for forming the organic electroluminescent layer. Thus, it is a waste of time and cost to fabricate the array substrate on the first substrate when defects later occur in the organic electroluminescent layer during the fabrication.

Moreover, in the bottom emission type device, light is emitted in a direction toward the substrate where the lines and TFTs are disposed. Therefore, the display area decreases because the emitted light is blocked by these lines and TFTs. In the top emission type device, since light is emitted in a direction opposite to the substrate where the lines and TFTs are disposed, the display area can increase as much as it can, and it is easy to design the TFT into a designated shape. However, since the top emission type organic electroluminescent display device of the conventional related art has the cathode electrode on the organic electroluminescent layer, the cathode electrode is generally formed of a transparent or translucent material that may block some of the light emitted from the organic electroluminescent layer that decreases light efficiency.

To prevent the decrease of the light permeability, a thin film passivation layer may be formed over the entire surface of the substrate. However, in this case of forming the thin film passivation layer, the outer atmosphere is not prevented sufficiently and may affect the organic electroluminescent diode.

SUMMARY OF THE INVENTION

Accordingly, the present invention is directed to an organic electroluminescent device that substantially obviates one or more of the problems due to limitations and disadvantages of the related art.

An object of the present invention is to provide a method of an active matrix organic electroluminescent display device which improves fabrication yield.

Another object is to produce an active matrix organic electroluminescent display device having an improved resolution and a high aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes first and second substrates attached by a seal pattern, array elements including a plurality of thin film transistors formed on the first substrate, a first electrode formed on a rear surface of the second substrate, a plurality of electrode separators formed on the rear surface of the first electrode, wherein the plurality of electrode separators is made of an insulating material defining sub-pixel regions that correspond to each thin film transistor, an organic electroluminescent layer formed on a rear surface of the first electrode in each of the sub-pixel regions, a second electrode formed on a rear surface of the organic electroluminescent layer in each of sub-pixel regions, a conductive connector formed between the first and second substrates in each sub-pixel region for connecting to the second electrode of a sub-pixel region.

In another aspect, an organic electroluminescent device includes first and second substrates attached by a seal pattern, array elements including a plurality of thin film transistors formed on the first substrate, a color changing medium formed on a rear surface of the second substrate, wherein the color changing medium has a black matrix that defines sub-pixel regions having red, green and blue color changing layers respectively corresponding to each sub-pixel region of a pixel, a first electrode formed on a rear surface of the color changing medium, an organic electroluminescent layer formed on a rear surface of the first electrode, wherein the organic electroluminescent layer emits blue light, a second electrode formed on a rear surface of the organic electroluminescent layer, the second electrode corresponding to the sub-pixel region, a plurality of electrode separators on the rear surface of the first electrode corresponding in position to the black matrix in defining the sub-pixel regions; and a plurality of conductive connectors formed between the first and second substrates, each conductive connector electrically connecting an array element to the second electrode in each sub-pixel region.

In another aspect, an organic electroluminescent device includes first and second substrates attached by a seal pattern, array elements including a plurality of thin film transistors, each thin film transistor being formed on the first substrate and disposed corresponding to each sub-pixel regions, a first electrode formed on a rear surface of the second substrate, an organic electroluminescent layer formed on a rear surface of the first electrode, the organic electroluminescent layer including red, green and blue luminous layers each corresponding to a separate sub-pixel region, a second electrode on a rear surface of the organic electroluminescent layer in each of the sub-pixel regions, a buffer electrode on a rear surface of the second electrode in each of the sub-pixel regions, and a plurality of conductive connectors formed between the first and second substrates, each conductive connector electrically connecting an array element to the buffer electrode in each sub-pixel region.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings. Wherever possible, similar reference numbers will be used throughout the drawings to refer to the same or like parts.

The present invention provides an active matrix organic electroluminescent display device that has an improved fabrication yield, an improved resolution and a high aperture ratio. In the present invention, array elements, such as thin film transistors and organic electroluminescent diodes, are formed on separate substrates, respectively. And then, the array elements of the first substrate are electrically connected to the organic electroluminescent diodes of the second substrate by conductive connectors. The shape and structure of the conductive connectors can be varied to protect the organic electroluminescent diode from damage caused by pressure from the conductive connector when the first and second substrates are attached.

Figure 1:
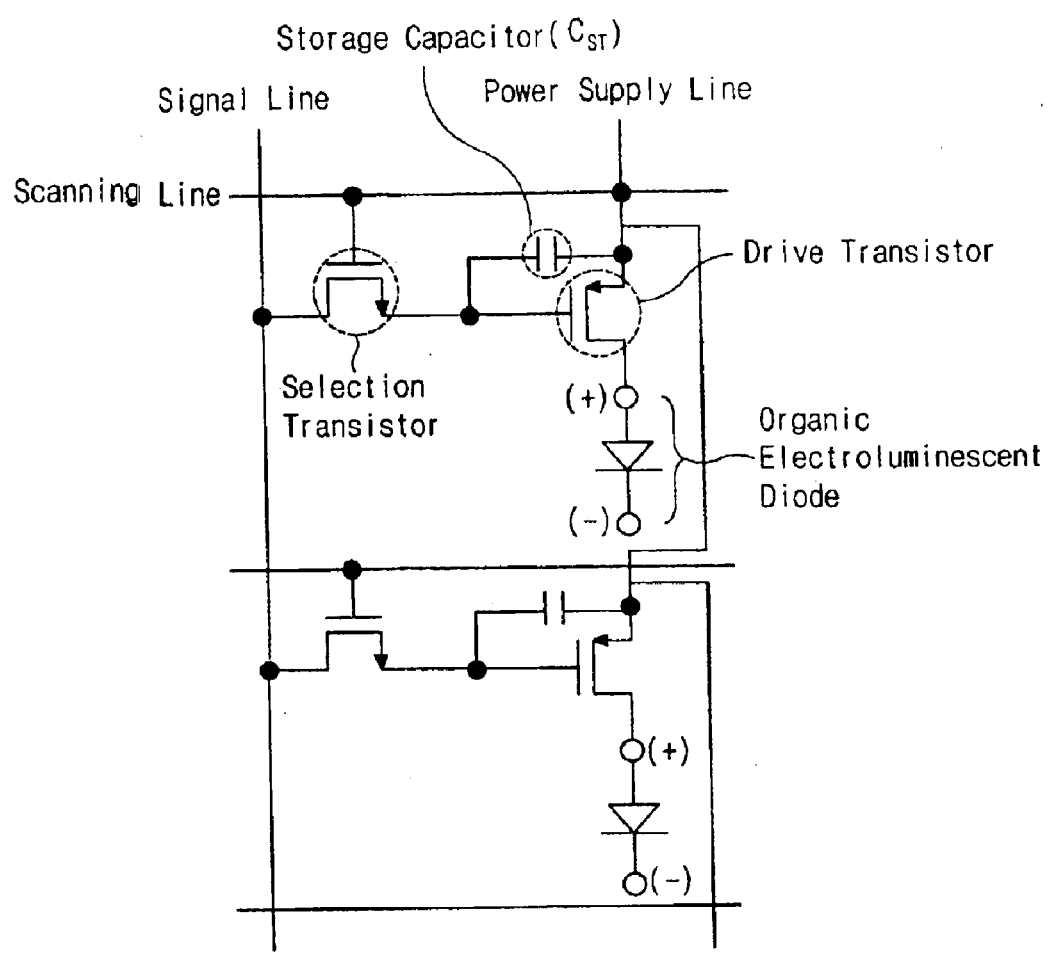
FIG. 1 shows an equivalent circuit diagram of pixels in the active matrix type organic electroluminescent display device according to the related art.
Figure 2:
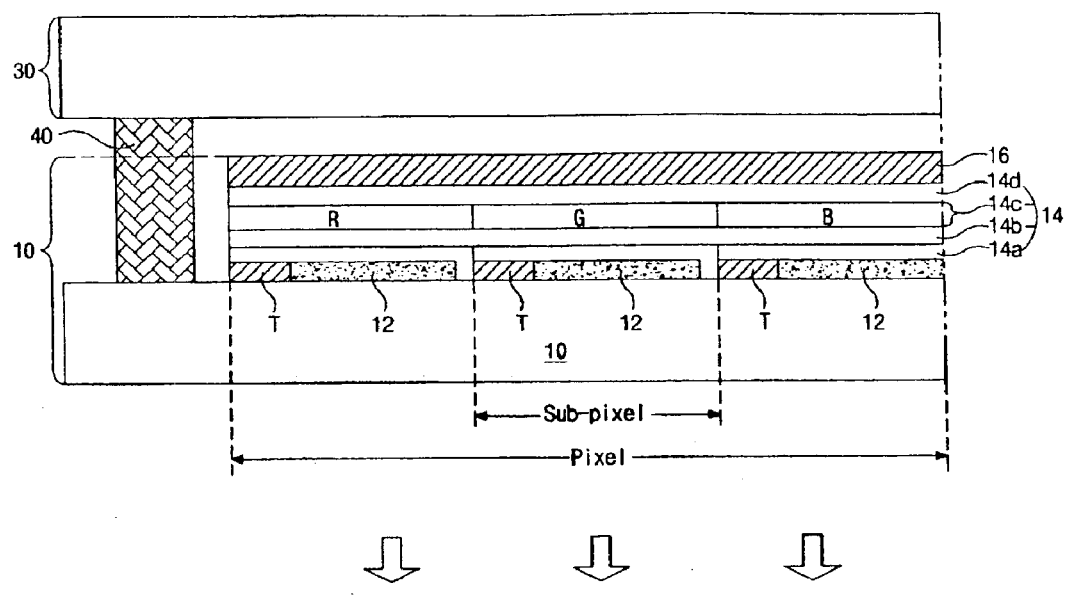
FIG. 2 is a partial cross-sectional view of a bottom emission type organic electroluminescent device showing one pixel having red (R), green (G) and blue (B) sub-pixel regions according to the related art.
Figure 3:
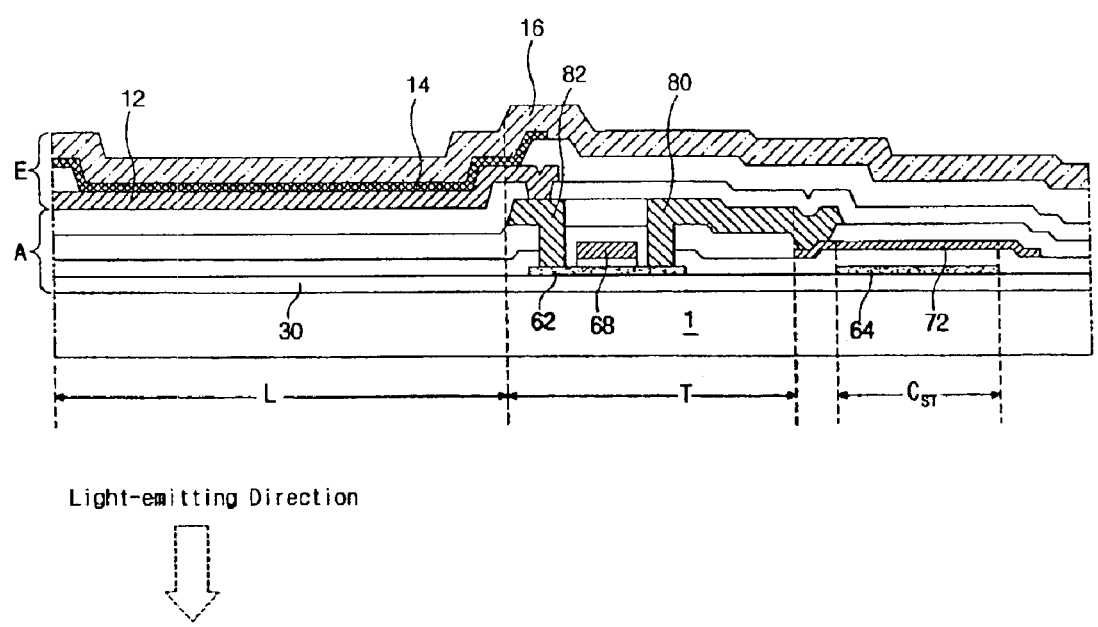
FIG. 3 is an enlarged cross-sectional view of one pixel of the bottom emission type organic electroluminescent display device shown in FIG. 2.
Figure 4:
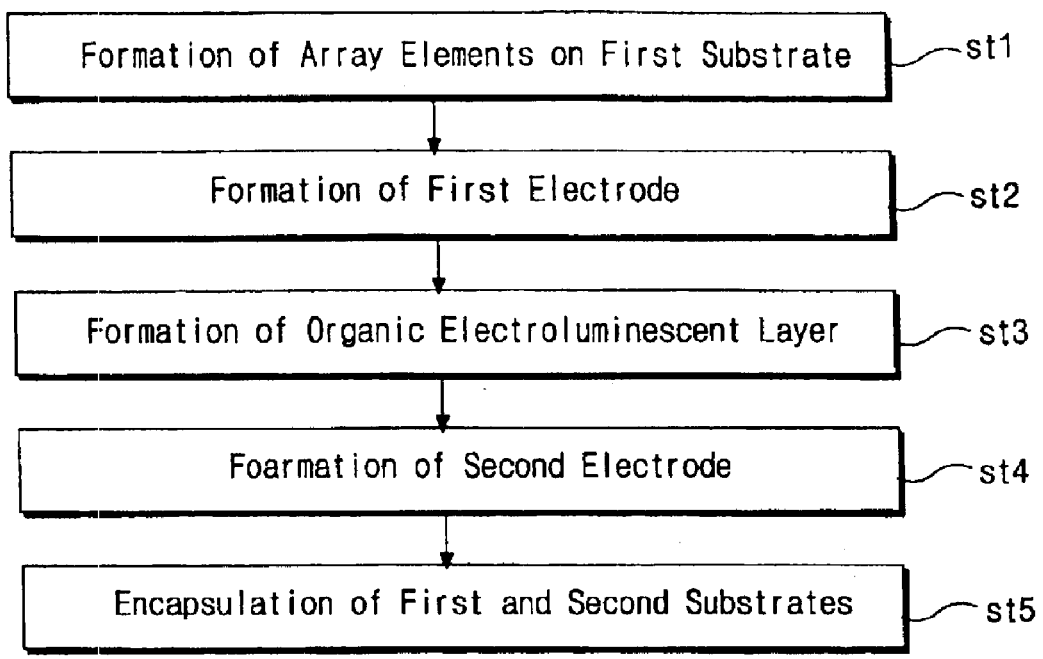
FIG. 4 is a flow chart illustrating a fabrication process of the organic electroluminescent device shown in FIG. 3 according to the related art.
Figure 5:
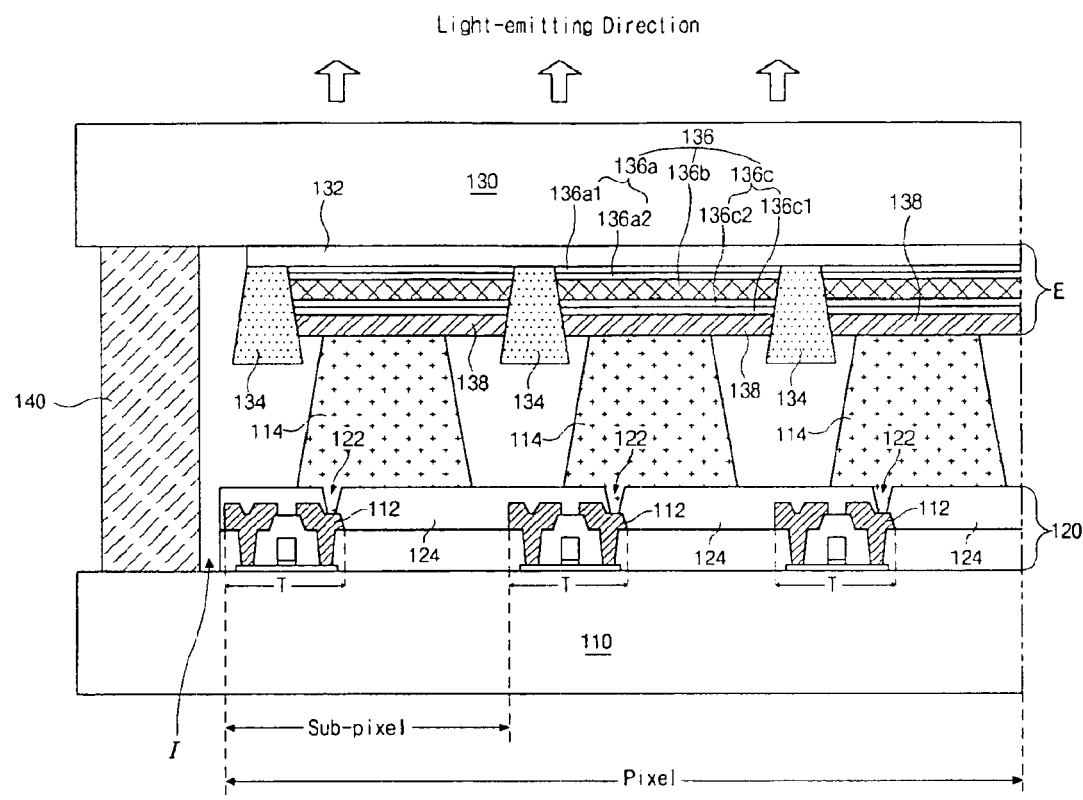
FIG. 5 is a cross-sectional view of a top emission type organic electroluminescent display device showing one pixel according to a first embodiment of the present invention.

FIG. 5 is a cross-sectional view of a top emission type organic electroluminescent display device showing one pixel according to a first embodiment of the present invention. As shown in FIG. 5, first and second substrates 110 and 130 are spaced apart from each other. The first and second substrates 110 and 130 are attached to each other by a seal pattern 140. On a front surface of the first substrate 110, array elements 120 are formed. On a rear surface of the second substrate 130, organic electroluminescent diodes E are disposed. Each of the organic electroluminescent diodes E includes a first electrode 132, electrode separator 134, an organic electroluminescent layer 136 and a second electrode 138. The first electrode 132 is disposed on the whole surface of the second substrate 130 and acts as a common electrode. The electrode separators 134 are formed of an insulating material. Electrode separators 134 are disposed inboard of a pixel such that the electrode separators 134 divide a pixel into three sub-pixel regions. In intervals between the electrode separators 134, each of which is called a sub-pixel region, the electroluminescent layer 136 and the second electrode 138 are sequentially formed on the first electrode. Thus, a sub-pixel region includes the electroluminescent layer 136 and the second electrode 138 that are separated from the neighboring sub-pixel region by the electrode separator 134.

The organic electroluminescent layer 136 includes a first carrier transporting layer 136a, a luminous layer 136b and a second carrier transporting layer 136c in series. The first and second carrier transporting layers 136a and 136c inject and transport electrons or holes into the luminous layer 136b. The multiple structure of the organic electroluminescent layer 136 is determined depending on whether the first electrode 132 is anode or cathode. For example, if the first electrode 132 is an anode and the second electrode 138 is a cathode, the first carrier transporting layer 136a includes a hole injection layer 136a1 and a hole transporting layer 136a2 in series from the first electrode 132, and the second carrier transporting layer 136c includes an electron injection layer 136c1 and an electron transporting layer 136c2 in series from the second electrode 138. Furthermore, the luminous layer 136b is formed with a molecular substance that determines color of light emission.

Still referring to FIG. 5, the array elements 120 formed on the first substrate 110 include thin film transistors T and layers, such as storage capacitors and various lines. In each sub-pixel region, the thin film transistor T is connected to a conductive connector 114 in order to supply electrical current to the organic electroluminescent diode E. The conductive connector 114 has a pillar shape and electrically connects the thin film transistor T to the organic electroluminescent diode E. In the array elements 120, a passivation layer 124 covers the thin film transistors T. Drain electrodes 112 of the thin film transistors T are exposed by contact holes 122. Since the pillar-shaped conductive connectors 114 contact the drain electrodes 112 of the thin film transistors T through the contact holes 122 and the second electrodes 138 of the organic electroluminescent diodes E contact the pillar-shaped conductive connector 114, the pillar-shaped conductive connectors 114 can electrically connect the thin film transistors T of the first substrate 110 to the organic electroluminescent diodes E of the second substrate 130.

Although the drain electrodes 112 are exposed and connected to the conductive connectors 114 in FIG. 5, source electrodes of the thin film transistors T or other additional metal patterns can make contact to conductive connectors 114, which are connected to array elements other than the organic electroluminescent diodes E. The thin film transistor T shown in FIG. 5, which is electrically connected to the organic electroluminescent diode E, drives the organic electroluminescent diodes E in the sub-pixel regions. The conductive connectors 114 are formed of a conductive material having a high ductility and a low specific resistance. The conductive connectors 114 are first formed on the array elements 120 and are then connected to the second electrodes 138 of the organic electroluminescent diodes E when the first substrate 110 having the array elements 120 thereon is attached to the second substrate 130 having the electroluminescent diodes E thereon.

Further, the organic electroluminescent display device shown in FIG. 5 is a top emission type OED device in which light is emitted through the second substrate 130 in a direction away from the substrate having the thin film transistors T. Therefore, the first electrode 132 of the organic electroluminescent diode E is made of a transparent or translucent conductive material, while the second electrode 138 is made of an opaque metallic material. When the first and second substrates 110 and 130 are attached to each other by the seal pattern 140, a cell gap I is produced between the first and second substrates 110 and 130. To protect the structural elements of the organic electroluminescent display device, the cell gap I can be filled up with an inert gases. Although not shown in FIG. 5, the array elements 120 further include scanning lines, signal line, power supply lines and storage capacitors.

In the shown in FIG. 5, the array elements on the first substrate are formed separately from the organic electroluminescent diodes on the second substrate. For example, the first substrate having the array elements is formed and then the second substrate having the organic electroluminescent diode is fabricated. Subsequently, these substrates are encapsulated after an examination that determines whether the array elements or the organic electroluminescent diode have any defects, respectively. If the first substrate having the array elements or the second substrate having the organic electroluminescent layer are found to have any defects, the substrate having a defect can be easily replaced by another defect-free substrate. Therefore, satisfactory and reliable organic electroluminescent display devices can be obtained in accordance with the present invention such that yield and/or productivity can be increase. Furthermore, since the organic electroluminescent display device of the present invention is the top emission type where light is emitted opposite from the substrate having the thin film transistors, the aperture ratio can be improved and it is easy to manufacture the thin film transistor having a designated shape or being of a designated type. For example, the thin film transistor according to the present invention can not only be the coplanar type shown in FIG. 5 but also can be a stagger or inverted stagger type.

Figure 6:
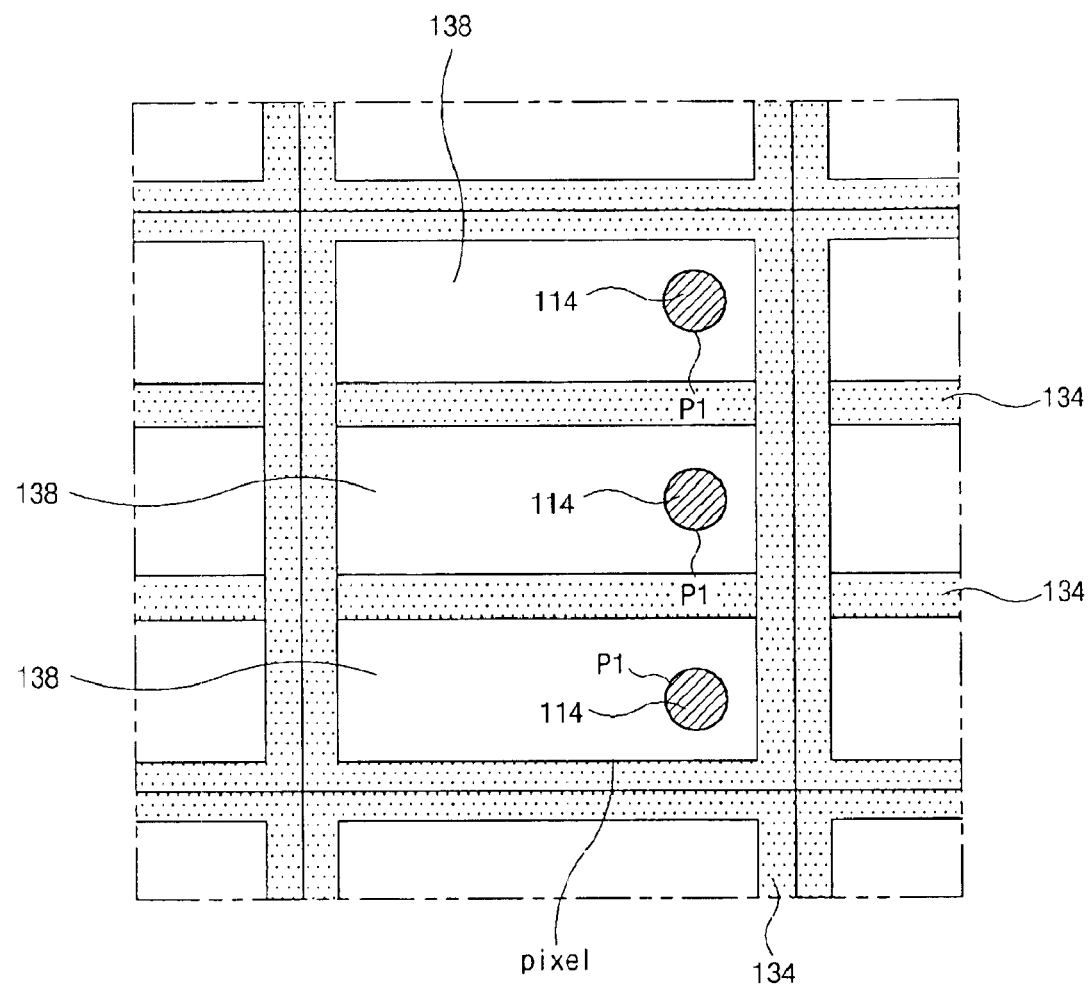
FIG. 6 is a plan view of one pixel and illustrates a connection of a second electrode and conductive connectors according to the first embodiment of the present invention.

FIG. 6 is a schematic plan view of one pixel and illustrates a connection of a second electrode and conductive connectors according to the first embodiment of the present invention. As shown in FIG. 6, the electrode separator 134 is disposed between the sub-pixel regions such that the electrode separator 134 defines the sub-pixel regions. In each sub-pixel region, a second electrode 138 is disposed. A conductive connector 114 is disposed in each sub-pixel region and contacts the second electrode 138 in each sub-pixel region. The contact of the second electrode 138 and the conductive connector 114 occurs at a contact area P1. The contact area P1 is a contact point having a circular shape as a result of having a planar circular plateau at the top portion of the conductive connector 114 that contacts to a second electrode 138. Of course, the contact areas P1 can each be contact points that are other geometric shapes. Moreover, as shown in FIG. 6, the contact areas P1 are disposed in periphery of each of the sub-pixel regions to prevent the pressure from the conductive connectors that occurs while attaching the substrate from causing damage to the main aperture area in the sub-pixel regions.

Figure 7:
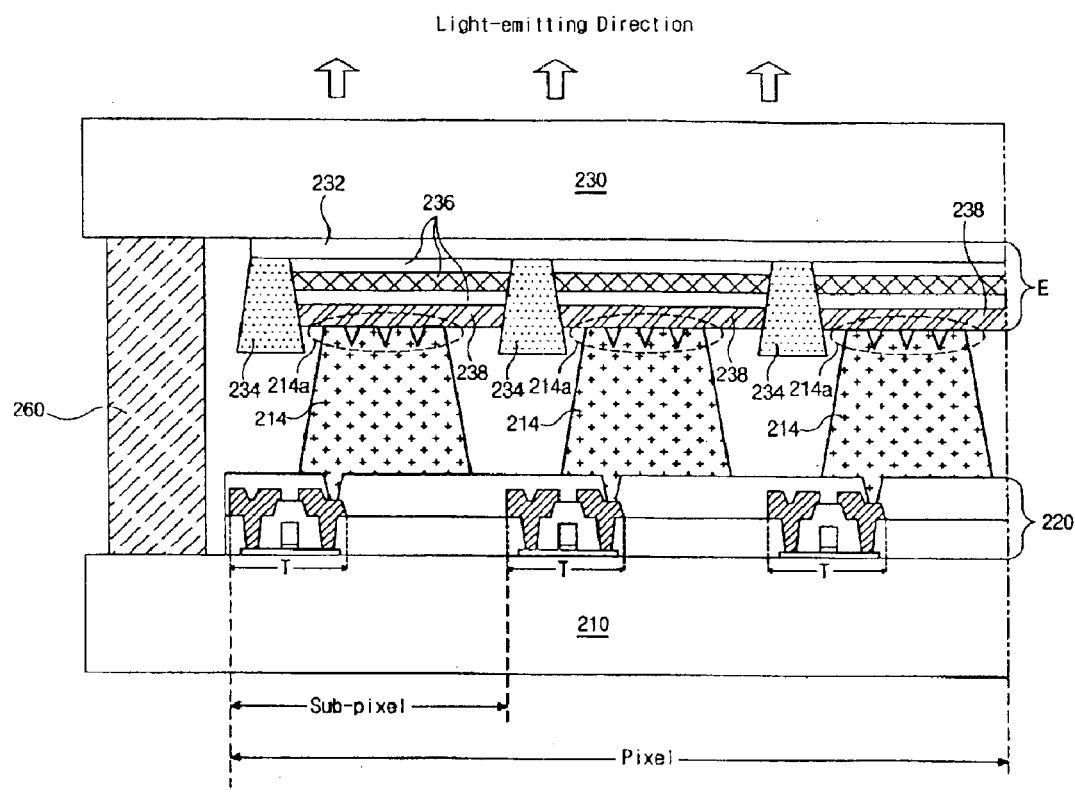
FIG. 7 is a cross-sectional view of a top emission type organic electroluminescent display device showing one pixel according to a second embodiment of the present invention.

FIG. 7 is a cross-sectional view of a top emission type organic electroluminescent display device showing one pixel according to a second embodiment of the present invention. The organic electroluminescent display device shown in FIG. 7 is similar to that of the first embodiment, but the conductive connectors have an unevenness or irregular shape at their top portions where the conductive connectors contact to the second electrodes of the organic electroluminescent diodes E. Repetitive explanations are omitted for features in the second embodiment that are the same as features in the first embodiment.

As shown in FIG. 7, a first substrate 210 having array elements 220 thereon is attached to a second substrate 230 having organic electroluminescent diodes E. The organic electroluminescent diodes E are formed on the rear surface of the second substrate 230. Each of the organic electroluminescent diodes E include a first electrode 232, an organic electroluminescent layer 236 and a second electrode 238 in series from the second substrate 230. A plurality of electrode separators 234 defines sub-pixel regions of a pixel. As mentioned before, the array elements 220 including the plurality of thin film transistors T are formed on the first substrate 210. A thin film transistor T is disposed in each sub-pixel region. A plurality of conductive connectors 214 is disposed between the array elements 220 of the first substrate 210 and the organic electroluminescent diodes E on the second substrate 230. Thus, as in the first embodiment, the conductive connectors 214 electrically connect the thin film transistors T to the organic electroluminescent diodes E. The conductive connectors 214 have an uneven shape or irregular surface 214a at their top portions where the conductive connectors 214 contact the second electrode 238 of the organic electroluminescent diodes E.

The organic electroluminescent diode E needs to receive the current from the thin film transistor T such that the contact resistance of a contact point is minimized. If the contact resistance of a contact point becomes large, a resistance heating occurs in the contact area such that the organic electroluminescent diode E is thermally damaged. To prevent this current concentration phenomenon, the conductive connector 214 should avoid having only a single small contact point with the second electrode 238.

The uneven top portion 214a at the top portion of the conductive connector 214 creates many contact points with the second electrode 238 of the organic electroluminescent diode E. Therefore, when the first and second substrates 210 and 230 are attached to each other by the applying pressure, the pressure forces that the conductive connectors 214 apply to the second electrode 238 of the organic electroluminescent diode E can be distributed. The uneven shape or irregular surface 214a at the top portion can be formed by a photolithography process. Another method of forming the uneven shape or irregular surface 214a in the top portion is to use a coating layer and a plurality of seeds having uneven patterns.

Figure 8:
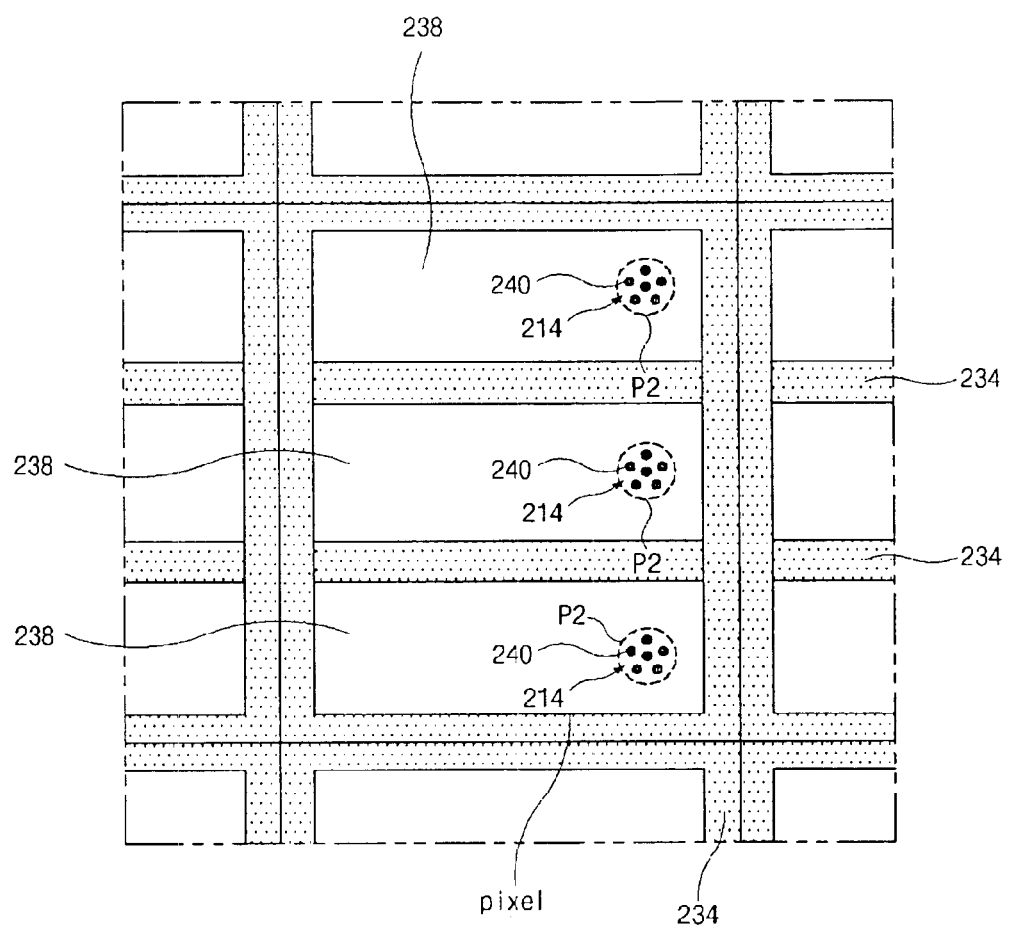
FIG. 8 is a plan view showing one pixel and conductive connectors according to a second embodiment of the present invention.

FIG. 8 is a plan view of a pixel illustrating the contact of conductive connectors according to the second embodiment of the present invention. In FIG. 8, the electrode separator 234 is disposed to define sub-pixel regions in the pixel. A second electrode 238 is disposed in each sub-pixel region. A connecting connector 214 is also disposed in each sub-pixel region and contacts a second electrode 238. The contact of the second electrodes 238 and the conductive connectors 214 is at contact areas P2. Since the top portions of the conductive connectors 214 have an uneven shape or irregular surface 214a, each contact area P2 has a plurality of point contacts 240. The uneven shape or irregular surface 214a at the top portion of the conductive connectors 214 of the second embodiment can distribute forces that occur between the conductive connector 214 and the second electrode 238. In addition, each of the point contacts 240 of the contact areas P2 provides stable and reliable attachment between the conductive connectors 214 and the second electrode 238 of the organic electroluminescent diode, thereby minimizing the damage to the organic electroluminescent diode.

Figure 9:
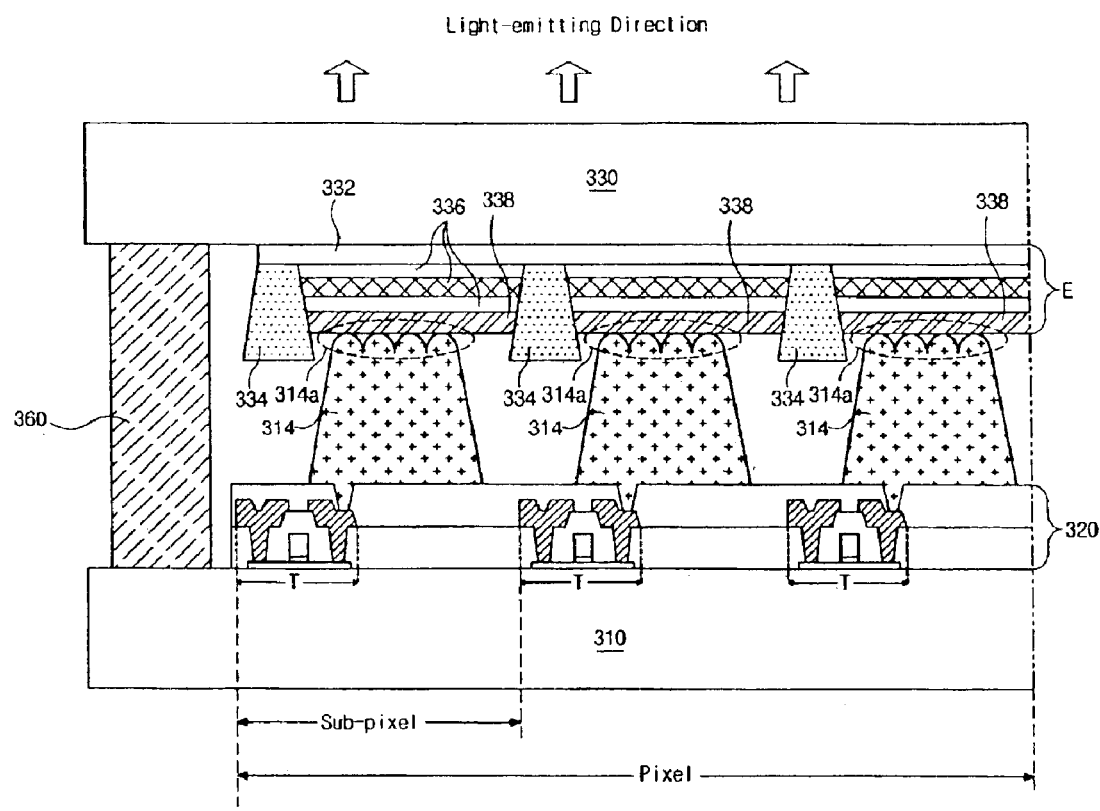
FIG. 9 is a cross-sectional view of a top emission type organic electroluminescent-display device showing one pixel according to a third embodiment of the present invention.

FIG. 9 is a cross-sectional view of a top emission type organic electroluminescent display device showing one pixel according to a third embodiment of the present invention. The organic electroluminescent display device shown in FIG. 9 is similar to that of the first and second embodiments, but has a different shape at the top portion of the conductive connectors 314. Repetitive explanations are omitted for features in the third embodiment that are the same as features in the first embodiment.

As shown in FIG. 9, a first substrate 310 having array elements 320 thereon is attached to a second substrate 330 having organic electroluminescent diodes E. The organic electroluminescent diodes E are formed on the rear surface of the second substrate 330. Each of the organic electroluminescent diodes E include a first electrode 332, an organic electroluminescent layer 336 and a second electrode 338 in series from the second substrate 330. A plurality of electrode separators 334 divides the pixel into sub-pixel regions. As mentioned before, the array elements 320 including a plurality of thin film transistors T are formed on the first substrate 310. Each thin film transistor T is disposed in a sub-pixel region. A plurality of conductive connectors 314 is disposed between the array elements 320 of the first substrate 310 and the organic electroluminescent diodes E on the second substrate 330. The conductive connectors 314 electrically connect the thin film transistors T to the organic electroluminescent diodes E. The conductive connectors 314 have a convex surfaces 314a at their top portions where the conductive connectors 314 contact the second electrode 338 of the organic electroluminescent diode E.

Due to the convex surfaces 314a at the top portions, the conductive connectors 314 may have point contacts with the second electrodes 338 of the organic electroluminescent diodes E. The convex top portion 314a decreases the pressure of forces applied to the second electrode 338 of the organic electroluminescent diode E. More particularly, the conductive conductor is formed of a highly ductile material and the convex surface allow a conductive conductor to more readily absorb force while maintaining contact to the second electrode 338.

Figure 10:
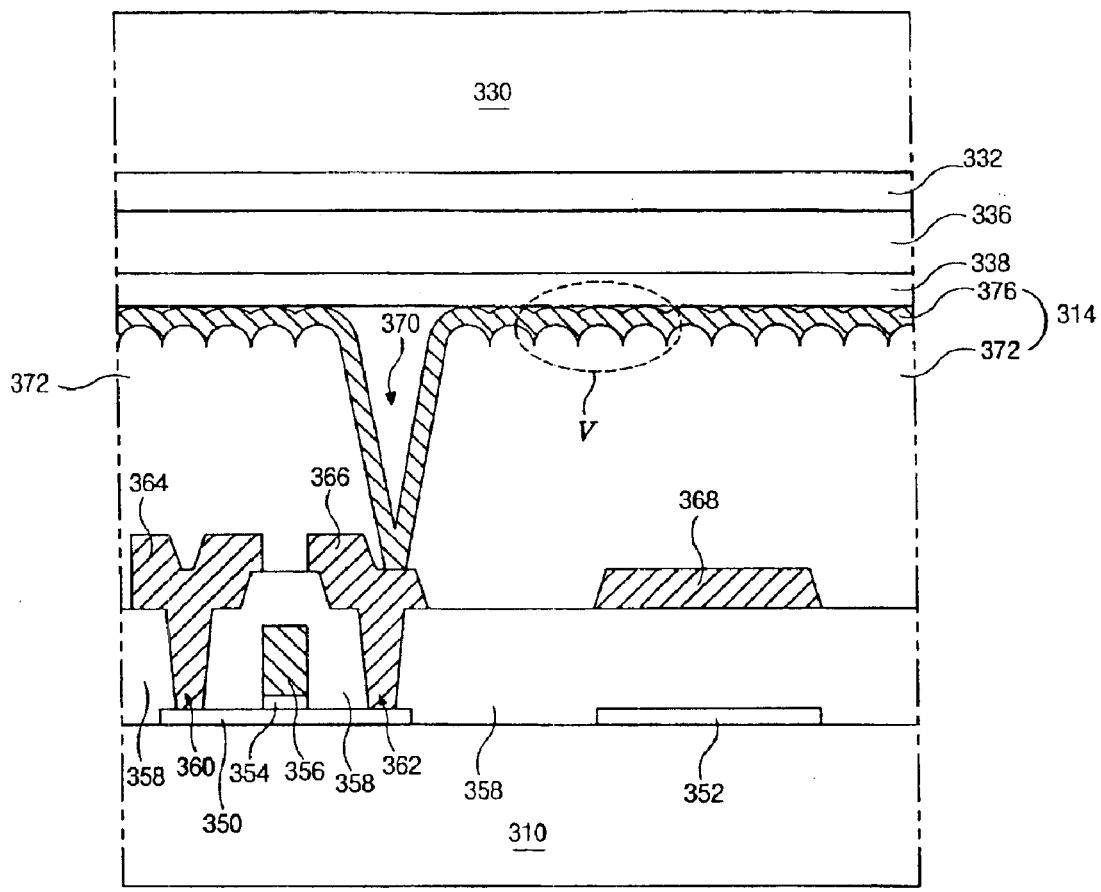
FIG. 10 is an enlarged cross-sectional view illustrating a thin film transistor and conductive connector according to a fourth embodiment of the present invention.

FIG. 10 is an enlarged cross-sectional view illustrating a thin film transistor and conductive connector according to a fourth embodiment of the present invention. As shown, a semiconductor layer 350 of polycrystalline silicon and a capacitor electrode 352 are formed on the first substrate 310. On the central part of the semiconductor layer 350, a gate insulation layer 354 and the gate electrode 356 are sequentially formed. An interlayer insulator 358 is formed on the first substrate 310 to cover the semiconductor layer 350, the capacitor electrode 352 and the gate electrode 356. The interlayer insulator 358 has first and second contact holes 360 and 362 that expose portions of the semiconductor layer 350, respectively, on both sides of the gate electrode 356. Source and drain electrodes 364 and 366 are formed on the interlayer insulator 358, and contact the semiconductor layer 350 through the first contact hole 360 and through the second contact hole 362, respectively. A power electrode 368 is formed on the interlayer insulator 358 and corresponds to the capacitor electrode 352. The power electrode 368 and the capacitor electrode 352 constitute a storage capacitor with the interlayer insulator 358 as a dielectric layer.

In the fourth embodiment of the present invention, the conductive connector 314 has a double-layered structure of first and second layers 372 and 376. The first layer 372 is generally formed of an insulating material, and covers the source and drain electrodes 364 and 366 and the power electrode 368. The first layer 372 of the conductive connector 314 has a third contact hole 370 that exposes a portion of the drain electrode 366. Furthermore, the first layer 372 has a convex surface V on its top. The second layer 376 of the conductive connector 314 formed on the first layer 372 is a conductive material. Since the top portion of the first layer 372 has a convex shaped surface V, the second layer 376 formed on the first layer 372 also has a convex shaped surface V. The second layer 376 of the conductive connector 314 contacts the drain electrode 366 through the third contact hole 370. The first and second layers 372 and 376 form the conductive connector 314 having the convex shaped surface V on the top portion. Since the second layer 376 is formed of the conductive material and contacts the drain electrode 366, it electrically connects the thin film transistor to the organic electroluminescent diode E.

Still referring to FIG. 10, the first electrode 332, the organic electroluminescent layer 336 and the second electrode 338 are formed on the rear surface of the second substrate 330 in series so as to constitute the organic electroluminescent diode. As described with reference to FIG. 9, the second electrode 338 contacts the convex shape V of the conductive connector 314. Further, the conductive connector 314 can have a multi-layered structure of more than two layers. The second layer 376 of the conductive connector 314 can be comprised of more than two conductive layers considering the contact property with the second electrode 338 of the organic electroluminescent diode. Although not shown in FIG. 10, the source electrode is electrically connected to a signal line, and the power electrode 368 is electrically connected to the power supply line. The first layer 372 is beneficially formed of a photoconductive material, such as polyactylate or polyimide.

Figure 11:
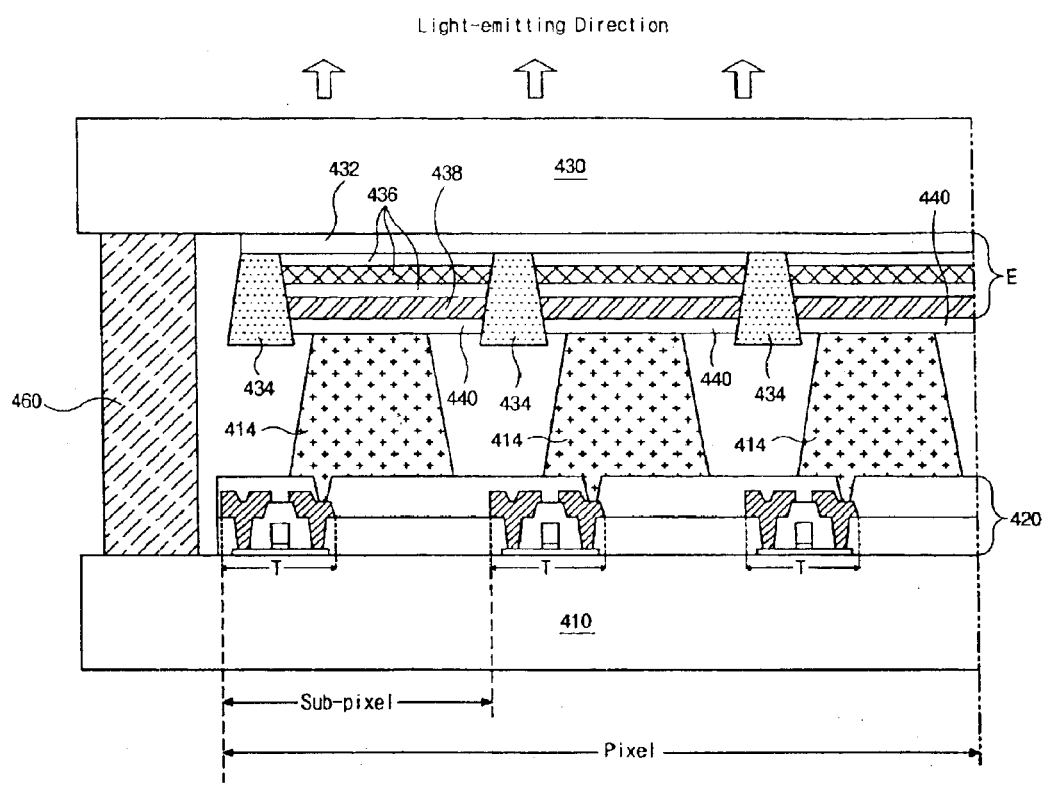
FIG. 11 is a cross-sectional view of a top emission type organic electroluminescent display device showing one pixel according to a fifth embodiment of the present invention.

FIG. 11 is a cross-sectional view of a top emission type organic electroluminescent display device showing one pixel according to a fifth embodiment of the present invention. The organic electroluminescent display device shown in FIG. 11 is similar to that of the previously mentioned embodiments, but has an additional layer on a rear surface of the organic electroluminescent diode. Repetitive explanations are omitted for features in the fifth embodiment that are the same as features in the first embodiment.

In FIG. 11, a first substrate 410 having array elements 420 thereon is spaced apart from a second substrate 430 having an organic electroluminescent diodes E. The first and second substrates 410 and 430 are attached to each other by a seal pattern 460. Each of the organic electroluminescent diodes includes a first electrode 432, an organic electroluminescent layer 436 and a second electrode 438 formed in series from the second substrate 430. A plurality of electrode separators 434 divides the pixel into sub-pixel regions. As mentioned before, the array elements 420 including the plurality of thin film transistors T are formed on the first substrate 410. A thin film transistor T is disposed in each sub-pixel region.

In the fifth embodiment of the present invention, a buffer electrode 440 is formed on the rear surface of each of the organic electroluminescent diodes E. Thus, a plurality of conductive connectors 414 is disposed between the array elements 420 of the first substrate 410 and the buffer electrode 440. More specifically, each of the organic electroluminescent diodes E further includes a buffer electrode 440 on the rear surface of the second electrode 438. Since the buffer electrode 440 is formed of a conductive material, the conductive connectors 414 electrically connect the thin film transistors T to the organic electroluminescent diode E.

The first and second electrodes 432 and 438 of the organic electroluminescent diode E are generally formed in an evaporator. However, the metal thin films of the first and second electrodes 432 and 438, which are formed in an evaporator, are easily damaged and separate easily from the organic electroluminescent diode E. The buffer electrode 440 formed on the second electrode 438 prevents the damage and separation of the second electrode 438 from the organic electroluminescent diode E. In this embodiment, the buffer electrode 440 is formed by a sputtering device using a metallic material including aluminum (Al). For example, the buffer electrode 440 can be made of aluminum neodymium (AlNd).

Figure 12:
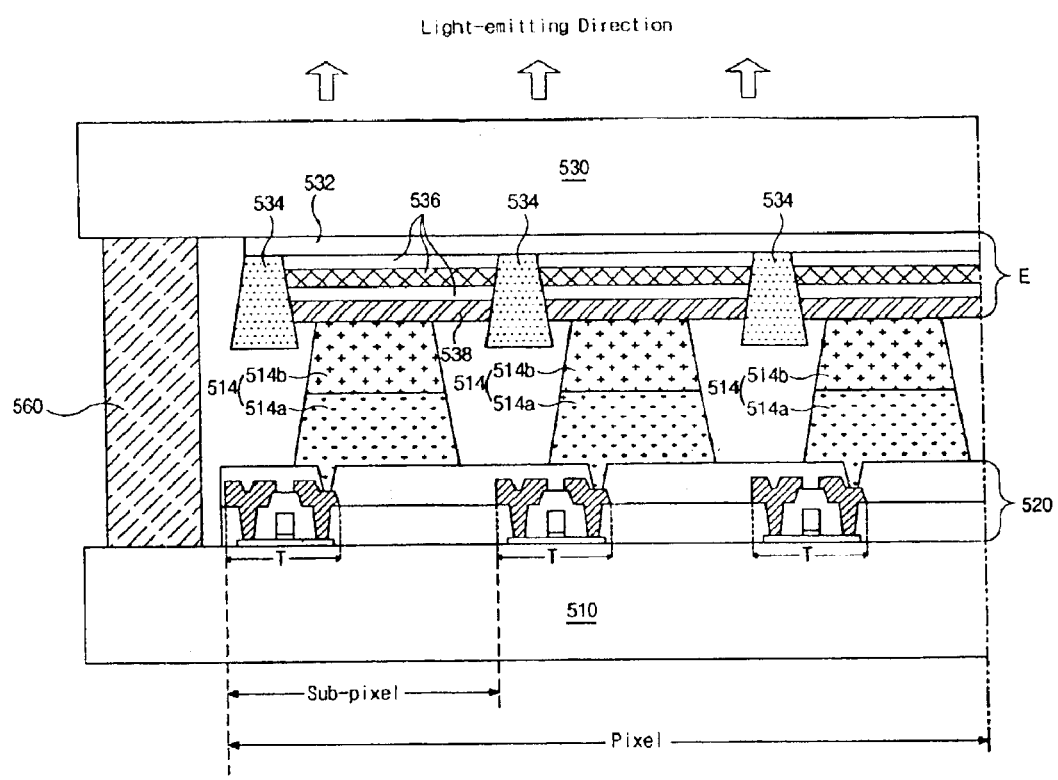
FIG. 12 is a cross-sectional view of a top emission type organic electroluminescent display device showing one pixel according to a sixth embodiment of the present invention.

FIG. 12 is a cross-sectional view of a top emission type organic electroluminescent display device showing one pixel according to a sixth embodiment of the present invention. The organic electroluminescent display device shown in FIG. 12 is similar to that of the previously mentioned embodiments, but has a double-layered structure in the conductive connector. Repetitive explanations are omitted for features in the sixth embodiment that are the same as features in the first embodiment.

In FIG. 12, a first substrate 510 having array elements 520 thereon is spaced apart from a second substrate 530 having organic electroluminescent diodes E. The first and second substrates 510 and 530 are attached to each other by a seal pattern 560. Each of the organic electroluminescent diodes E is formed on the rear surface of the second substrate 530, and includes a first electrode 532, an organic electroluminescent layer 536 and a second electrode 538 in series from the second substrate 530. An electrode separator 534 divides the pixel into sub-pixel regions. As mentioned before, the array elements 520 including the plurality of thin film transistors T are formed on the first substrate 510. Each thin film transistor T is disposed in a sub-pixel region.

In the sixth embodiment of the present invention, each conductive connector 514 is a double-layered structure having a first metal layer 514a and a second metal layer 514b. The first metal layer 514a is a metallic material having specific resistance lower than the specific resistance of the second metal layer 514b. The second metal layer 514b formed on the first metal layer 514a is also a metallic material but has a larger ductility than the ductility of the first metal layer 514a. Thus, the first metal layer 514a, which contacts the thin film transistor T, is made of the metallic material having a low specific resistance. Further, the second metal layer 514b, which substantially contacts the organic electroluminescent diode E, is made of the metallic material having a higher ductility. Due to the high ductility of the second metal layer 514b in the conductive connector 514, possible damage caused to the organic electroluminescent diode E is minimized when the first and second substrates 510 and 530 are aligned and attached. Due to the low specific resistance of the first metal layer 514a of the conductive connector 514, the electric resistance of the conductive connector 514 can be minimized.

Figure 13:
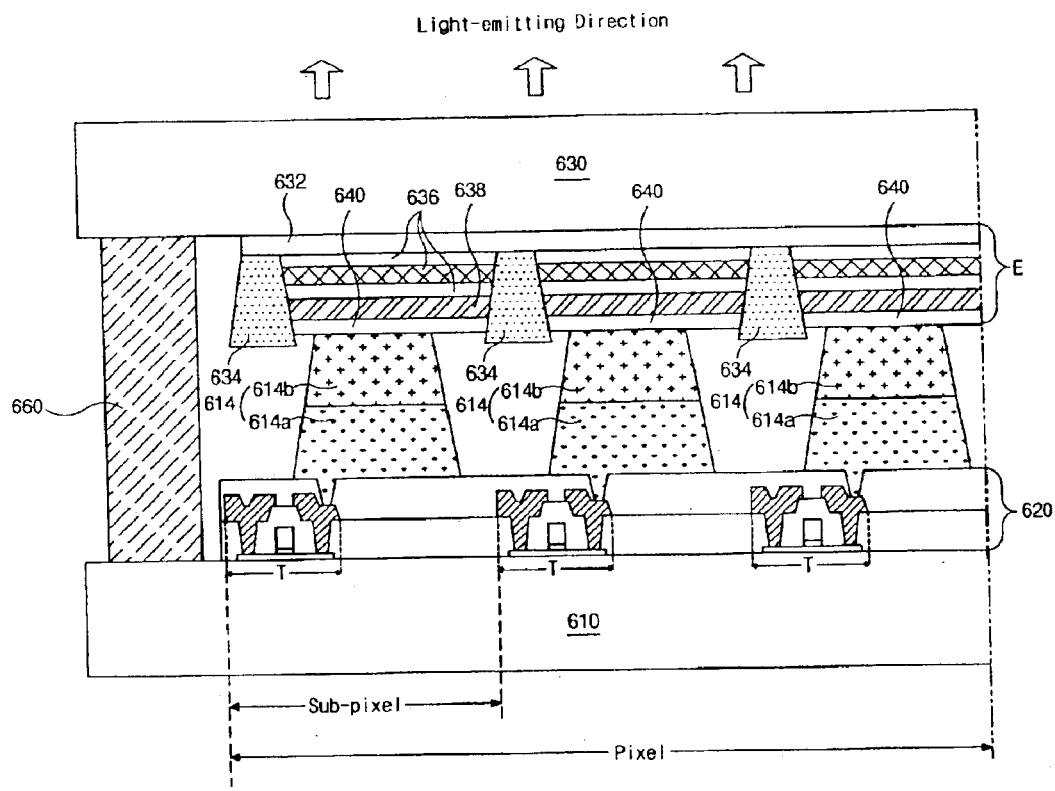
FIG. 13 is a cross-sectional view of a top emission type organic electroluminescent display device showing one pixel according to a seventh embodiment of the present invention.

FIG. 13 is a cross-sectional view of a top emission type organic electroluminescent display device showing one pixel according to a seventh embodiment of the present invention. The organic electroluminescent display device shown in FIG. 13 is similar to that of the sixth embodiment, but has an additional conductive layer on a rear surface of the organic electroluminescent diode. Repetitive explanations are omitted for features in the seventh embodiment that are the same as features in the first embodiment.

In FIG. 13, a first substrate 610 having array elements 620 disposed thereon is spaced apart from a second substrate 630 having an organic electroluminescent diode E. The first and second substrates 610 and 630 are aligned and attached to each other by a seal pattern 660. The organic electroluminescent diode E is formed on the rear surface of the second substrate 630, and includes a first electrode 632, an organic electroluminescent layer 636 and a second electrode 638 in series from the second substrate 630. A plurality of electrode separators 634 divides both the organic electroluminescent layer 636 and the second electrode 638 into the sub-pixel regions. As mentioned before, the array elements 620 including the plurality of thin film transistors T are formed on the first substrate 610. Each thin film transistor T is disposed in each sub-pixel region.

In the seventh embodiment of the present invention, a buffer electrode 640 is formed on the rear surface of the organic electroluminescent diode E. Thus, a plurality of conductive connectors 614 is disposed between the array elements 620 of the first substrate 610 and the buffer electrode 640. Namely, the organic electroluminescent diode E further includes the buffer electrode 640 on the rear surface of the second electrode 638. Since the buffer electrode 640 is formed of the conductive material, the conductive connectors 614 electrically connect the thin film transistors T to the organic electroluminescent diode E. Although FIG. 13 shows a one-layered buffer electrode 640, it can be a multi-layered structure.

Moreover in the seventh embodiment of the present invention, each conductive connector 614 is a double-layered structure having a first metal layer 614a and a second metal layer 614b. The first metal layer 614a is a metallic material having specific resistance that is lower than the second metal layer 614b. The second metal layer 614b formed on the first metal layer 614a is also a metallic material and has a higher ductility than the first metal layer 614a. As described in the sixth embodiment, due to the high ductility of the second metal layer 614b of the conductive connector 614, possible damage caused to the organic electroluminescent diode E is minimized when the first and second substrates 610 and 630 are aligned and attached. Further, because of the buffer electrode 640, the organic electroluminescent diode E can have a much more stable structure.

Figure 14:
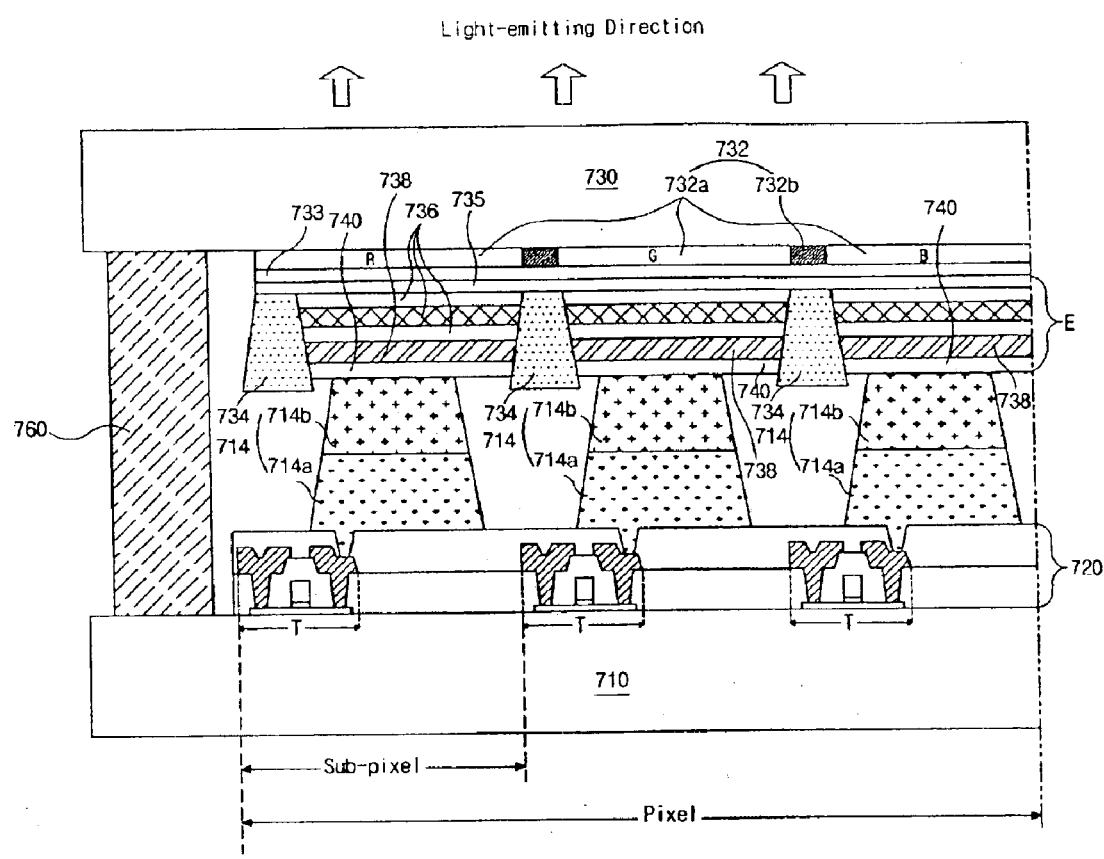
FIG. 14 is a cross-sectional view of a top emission type organic electroluminescent display device showing one pixel according to an eighth embodiment of the present invention.

FIG. 14 is a cross-sectional view of a top emission type organic electroluminescent display device showing one pixel according to an eighth embodiment of the present invention. The eighth embodiment is different from the previously mentioned embodiment because a color changing medium (CCM) is utilized to display the primary colors (red, green and blue). In FIG. 14, first and second substrates 710 and 730 are spaced apart from each other. On a front surface of the first substrate 710, array elements 720 are formed. A color change medium 732 having a black matrix 732b and red (R), green (G) and blue (B) color changing layers 732a is formed on a rear surface of the second substrate 730. Each red (R), green (G) or blue (B) color changing layer 732a corresponds to each sub-pixel region. The black matrix 732b is formed on the second substrate 730 among the red (R), green (G) and blue color changing layers 732a in order to prevent a light leakage and a cross color that is caused by a color interference. The red (R), green (G) and blue (B) color changing layers 732a and the black matrix 732b constitute the color changing medium (CCM) 732 in the present embodiment. A planarizing layer 733 is formed on the rear surface of the color changing medium 732. A first electrode 735 of an organic electroluminescent diode E is disposed on the rear surface of the planarizing layer 733. The first electrode 735 is a transparent conductive material. A plurality of electrode separators 734 of insulating material are formed on the rear surface of the first electrode 735. Each of the electrode separators 734 divides a pixel into the sub-pixel region and corresponds to the black matrix 732b. The electrode separators 734 have a trapezoid shape like a taper. In intervals among the plurality of taper-shaped electrode separators 734, each of which is called a sub-pixel region, an electroluminescent layer 736, a second electrode 738 and a buffer electrode 740 are sequentially formed. Thus, the sub-pixel region includes the electroluminescent layer 736, the second electrode 738 and the buffer electrode 740 which are separated from those of the next sub-pixel region by the electrode separator 734.

Still referring to FIG. 14, the electrode separators 734 are structural elements that make the second electrode 738 and buffer electrode 740 be patterned in each sub-pixel region, and thus the electrode separators 743 is required to have a trapezoid shape such that the bottom is wider than the top.

In the peripheries of the first and second substrates 710 and 730, a seal pattern 760 is formed to attach the first and second substrates 710 and 730 and make a cell gap between the first and second substrates 710 and 730. The array elements 720 formed on the first substrate 710 include thin film transistors T. Furthermore, conductive connectors 714 are formed on the array elements, each in the sub-pixel region, in order to electrically connect the thin film transistor T of the first substrate 710 to the buffer electrode 740 of the second substrate 730.

In the eighth embodiment, the buffer electrode 740 is formed on the rear surface of the organic electroluminescent diode E. Thus, a plurality of conductive connectors 714 is disposed between the array elements 720 of the first substrate 710 and the buffer electrode 740. Namely, the organic electroluminescent diode E further includes the buffer electrode 740 on the rear surface of the second electrode 738. Since the buffer electrode 740 is formed of the conductive material, the conductive connectors 714 electrically connect the thin film transistors T to the organic electroluminescent diode E.

In the eighth embodiment of FIG. 14, the organic electroluminescent layer 736 emits blue light that has a rather higher energy among the primary red, green and blue light. The organic electroluminescent layer 736 is a multiple structure of layer which is determined depending on whether the first electrode 740 is anode or cathode. For example, if the first electrode 735 is an anode and the second electrode 738 is a catode, the organic electroluminescent layer 736 includes a hole injection layer, a hole transporting layer, an emission layer, an electron transporting layer and a electron transporting layer in series from the second electrode 738.

In the eighth embodiment, the organic electroluminescent layer 736 provides the blue light to the red, green and blue color changing layers 732a so that the red, green and blue color changing layers 732a convert the provided blue light into three primary colors of red, green and blue. Moreover in the eighth embodiment of the present invention, each conductive connector 714 is a double-layered structure having a first metal layer 714a and a second metal layer 714b. The first metal layer 714a is a metallic material having low specific resistance and is formed on the array elements 720 of the first substrate 710. The second metal layer 714b formed on the first metal layer 714a is also a metallic material but has a higher ductility than the first metal layer 714a. Due to the high ductility of the second metal layer 714b of the conductive connector 714, possible damage caused to the organic electroluminescent diode E is minimized when the first and second substrates 710 and 730 are aligned and attached. Further, because of the buffer electrode 740, the organic electroluminescent diode E can have much more reliable and stable contact structure.

Figure 15:
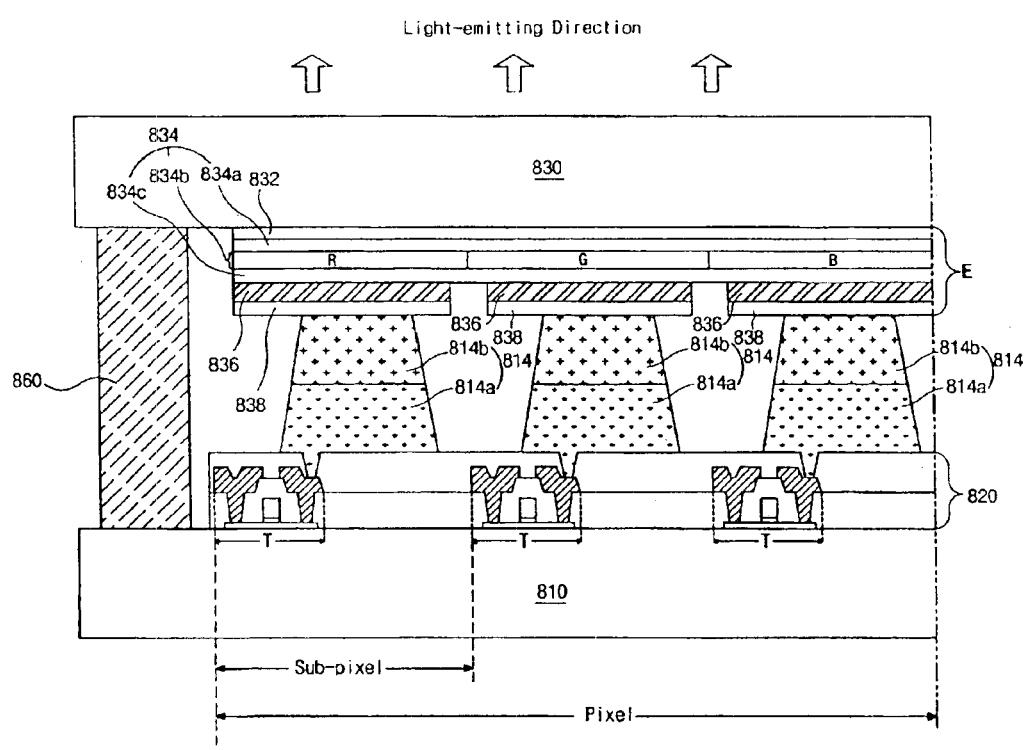
FIG. 15 is a cross-sectional view of a top emission type organic electroluminescent display device showing one pixel according to a ninth embodiment of the present invention.

FIG. 15 is a cross-sectional view of a top emission type organic electroluminescent display device showing one pixel according to a ninth embodiment of the present invention. The organic electroluminescent display device shown in FIG. 15 is similar to that of the seventh embodiment, but has a different structure in separating the second and buffer electrodes. Repetitive explanations are omitted for features in the ninth embodiment that are the same as features in the first embodiment.

In FIG. 15, a first substrate 810 having array elements 820 thereon is spaced apart from a second substrate 830 having an organic electroluminescent diode E. The first and second substrates 810 and 830 are aligned and attached to each other by a seal pattern 860. A plurality of organic electroluminescent diodes E is formed on the rear surface of the second substrate 830. Each of the organic electroluminescent diodes E includes a first electrode 832, an organic electroluminescent layer 834 and a second electrode 836 in series from the second substrate 830. Each organic electroluminescent diode E further includes a buffer electrode 838 on a rear surface of the second electrode 836.

The organic electroluminescent layer 834 of the organic electroluminescent diode E includes a first carrier transporting layer 834a, a red (R), green (G) and blue (B) luminous layer 834b and a second carrier transporting layer 834c in series. The first and second carrier transporting layers 834a and 834c inject and transport electrons or holes into the red (R), green (G) and blue (B) luminous layer 834b. Each of the red (R), green (G) and blue (B) corresponds to a sub-pixel region of a pixel.

In the ninth embodiment of the present invention, the electrode separators are not used. Further, the red (R), green (G) and blue (B) luminous layer 834b, the second electrode 836 and the buffer electrode 838 are formed through a shadow mask process such that the number of the fabrication process can be minimized.

As mentioned before, the array elements 820 including a plurality of thin film transistors T are formed on the first substrate 810. Each thin film transistor T is disposed in a sub-pixel region. Moreover in the ninth embodiment of the present invention shown in FIG. 15, each conductive connector 814 is a double-layered structure having a first metal layer 814a and a second metal layer 814b. The first metal layer 814a is a metallic material having low specific resistance and is formed on the array elements 820 of the first substrate 810. The second metal layer 814b formed on the first metal layer 814a is also a metallic material but has a higher ductility than the first metal layer. As described in the hereinbefore, due to the high ductility of the second metal layer 814b in the conductive connector 814, the possible damage caused to the organic electroluminescent diode E is minimized when aligning and attaching the first and second substrates 810 and 830. Further, because of the buffer electrode 838, the organic electroluminescent diode E can have much more stable and reliable contact structure.

According to the present invention, as described hereinbefore, the present invention provides array elements on the first substrate and an organic electroluminescent layer on the second substrate. The first substrate, having the array elements is formed separately from the second substrate having the organic electroluminescent layer. These substrates are encapsulated after an inspection that determines whether the array elements and the organic electroluminescent diode have any defects, respectively. If the first substrate having the array elements or the second substrate having the organic electroluminescent layer is found to have any defects, each substrate can be easily replaced by another defect-free substrate. Accordingly, a satisfactory and reliable organic electroluminescent display device can be obtained according to the present invention, and the productivity can increase. Further, since the organic electroluminescent display device of the present invention is a top emission type where the light is emitted through the substrate opposite to the substrate having the thin film transistors, the aperture ratio can be improved and it is easy to fabricate a thin film transistor into a designated shape. An improved resolution and long-time life span of the organic electroluminescent display device can also be obtained according to the present invention. Since the present invention provides the organic electroluminescent display device having a dual panel type, the outer atmosphere cannot come into the organic electroluminescent display device. Due to the encapsulation of the first and second substrates, the outside atmosphere cannot easily affect the organic electroluminescent diode. Further, because the conductive connectors can have various shapes and/or a multi-layered structure, the contacting characteristics between the conductive connectors and an electrode of the organic electroluminescent diode can be improved.

It will be apparent to those skilled in the art that various modifications and variation can be made in the organic electroluminescent display device of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
   first and second substrates attached by a seal pattern;
   array elements including a plurality of thin film transistors formed on the first substrate;
   a first electrode formed on a rear surface of the second substrate;
   a plurality of electrode separators formed on the rear surface of the first electrode, wherein the plurality of electrode separators is made of an insulating material defining sub-pixel regions that correspond to each thin film transistor,
   an organic electroluminescent layer formed on a rear surface of the first electrode in each of the sub-pixel regions;
   a second electrode formed on a rear surface of the organic electroluminescent layer in each of sub-pixel regions; and
   a conductive connector formed within a cell gap between the first and second substrates in each sub-pixel region for connecting to the second electrode of a sub-pixel region.

2. The device according to claim 1, wherein the conductive connector contacts each thin film transistor and has a planar top surface that contacts the second electrode.

3. The device according to claim 1, wherein each thin film transistor comprises:
   a semiconductor layer;
   a gate insulation layer on the semiconductor layer;
   a gate electrode on the gate insulation layer, wherein gate electrode is disposed above a central part of the semiconductor layer;
   a passivation layer covering both the semiconductor layer and the gate electrode, and having first and second contact holes that expose the semiconductor layer on both sides of the gate electrode;
   a source electrode on the passivation layer that contacts the semiconductor layer through the first contact hole; and
   a drain electrode on the passivation layer that contacts the semiconductor layer through the second contact hole.

4. The device according to claim 1, wherein the first electrode is anode, the second electrode is cathode, and the organic electroluminescent layer includes a hole injection layer, a hole transporting layer, a luminous layer, an electron transporting layer and an electron injection layer in series from the first electrode.

5. The device according to claim 1, further comprising a buffer electrode between the plurality of conductive connectors and the second electrode.

6. The device according to claim 5, wherein the buffer electrode is made of metallic material including aluminum.

7. The device according to claim 1, wherein the each conductive connector is a double-layered structure having a first metal layer and a second metal layer.

8. The device according to claim 7, wherein the first metal layer is a metallic material having a lower specific resistance than the second metal layer.

9. The device according to claim 8, wherein the second metal layer is metallic material having a larger ductility than the first metal layer.

10. The device according to claim 8, further comprising a buffer electrode between each conductive connector and the second electrode.

11. The device according to claim 10, wherein the buffer electrode is made of metallic material including aluminum.

12. The device according to claim 1, wherein the each conductive connector is a multi-layered structure having a plurality of metal layers.

13. The device according to claim 1, wherein the first electrode, the organic electroluminescent layer and the second electrode constitute an organic electroluminescent diode that emits light in a direction toward the second substrate.

14. The device according to claim 1, wherein the cell gap between the first and second substrates containing an inert gas.

15. The device according to claim 1, wherein each conductive connector has a trapezoidal like shaped taper.

16. The device according to claim 1, wherein the first electrode is made of a transparent conductive material and the second electrode is made of an opaque metallic material.

17. An organic electroluminescent device, comprising:
   first and second substrates attached by a seal pattern;
   array elements including a plurality of thin film transistors formed on the first substrate;
   a color changing medium formed on a rear surface of the second substrate, wherein the color changing medium has a black matrix that defines sub-pixel regions having red, green and blue color changing layers respectively corresponding to each sub-pixel region of a pixel;
   a first electrode attached on a rear surface of the color changing medium;
   an organic electroluminescent layer formed on a rear surface of the first electrode, wherein the organic electroluminescent layer emits blue light;
   a second electrode formed on a rear surface of the organic electroluminescent layer, the second electrode corresponding to the sub-pixel region;
   a plurality of electrode separators on the rear surface of the first electrode corresponding in position to the black matrix in defining the sub-pixel regions; and a plurality of conductive connectors formed between the first and second substrates, each conductive connector electrically connecting an array element to the second electrode in each sub-pixel region.

18. The device according to claim 17, wherein the first electrode is anode, the second electrode is cathode, and the organic electroluminescent layer includes a hole injection layer, a hole transporting layer, a luminous layer, an electron transporting layer and an electron injection layer in series from the first electrode.

19. The device according to claim 17, wherein the conductive connector is a double-layered structure having a first metal layer and a second metal layer.

20. The device according to claim 19, wherein the first metal layer is a metallic material having a lower specific resistance than the second metal layer.

21. The device according to claim 20, wherein the second metal layer is metallic material having a higher ductility than the first metal layer.

22. The device according to claim 21, further comprising a buffer electrode between each conductive connector and the second electrode.

23. The device according to claim 22, wherein the buffer electrode is made of metallic material including aluminum.

24. The device according to claim 17, wherein the conductive connector is a multi-layered structure having a plurality of metal layers.

25. The device according to claim 17, wherein the first electrode, the organic electroluminescent layer and the second electrode constitute an organic electroluminescent diode that emits light in a direction toward the second substrate.

26. The device according to claim 17, wherein a cell gap between the first and second substrates contains an inert gas.

27. The device according to claim 17, wherein each conductive connector has a trapezoidal like shaped taper.

28. The device according to claim 17, wherein the first electrode is made of a transparent conductive material and the second electrode is magic of an opaque metallic material.

* * * * *